United States Patent
Suyama et al.

(10) Patent No.: US 7,119,802 B2
(45) Date of Patent: Oct. 10, 2006

(54) DRIVING VOLTAGE CONTROLLER

(75) Inventors: Tooru Suyama, Kyoto (JP); Tsutomu Sakakibara, Kyoto (JP); Tomokazu Kojima, Ibaraki (JP); Tetsuro Ohmori, Hirakata (JP); Yoshito Date, Otsu (JP); Yasuyuki Doi, Nagaokakyo (JP); Masahiro Akabori, Osaka (JP); Kenji Miyake, Moriyama (JP); Miki Fujino, Takatsuki (JP); Takahito Kushima, Takatsuki (JP); Tsukasa Kawahara, Nagaokakyo (JP); Kazuhiko Nagaoka, Ibaraki (JP); Shinji Miyamoto, Nagaokakyo (JP); Yoshiyuki Konishi, Oumihachiman (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 317 days.

(21) Appl. No.: 10/350,421

(22) Filed: Jan. 24, 2003

(65) Prior Publication Data

US 2003/0151581 A1 Aug. 14, 2003

(30) Foreign Application Priority Data

Jan. 25, 2002 (JP) ............ P 2002-017099

(51) Int. Cl.
*G09G 5/00* (2006.01)
(52) U.S. Cl. ...................... 345/208; 345/98
(58) Field of Classification Search ........ 345/208–213, 345/98; 330/130, 133, 135, 136, 137; 323/280, 323/281
See application file for complete search history.

(56) References Cited

U.S. PATENT DOCUMENTS

| 5,148,250 | A | * | 9/1992 | Winnerl et al. | ............. 257/361 |
|---|---|---|---|---|---|
| 5,254,880 | A | * | 10/1993 | Horiguchi et al. | ......... 327/530 |
| 5,986,861 | A | * | 11/1999 | Pontarollo | .................... 361/56 |
| 6,184,855 | B1 | | 2/2001 | Kobayashi et al. | |
| 6,480,178 | B1 | * | 11/2002 | Itakura et al. | ................ 345/89 |
| 6,850,232 | B1 | * | 2/2005 | Tazuke | ....................... 345/204 |

FOREIGN PATENT DOCUMENTS

| JP | 62-218943 | 9/1987 |
|---|---|---|
| JP | 2054608 | 2/1990 |
| JP | 11-119741 | 4/1999 |

* cited by examiner

*Primary Examiner*—Amr A. Awad
*Assistant Examiner*—Steven Holton
(74) *Attorney, Agent, or Firm*—Pearne & Gordon LLP

(57) ABSTRACT

A compact-size driving voltage controller is provided which can be driven with low power. The compact-size driving voltage controller which can be driven with low power includes a High output operational amplifier and a Low output operational amplifier for supplying driving voltages VcomH, VcomL to a load such as a liquid crystal display panel, an output switch for alternating between the outputs of the operational amplifiers, a Low voltage setting operational amplifier for generating a set voltage to be supplied to the non-inverted input terminal of the Low output operational amplifier, a set voltage generator including a current mirror circuit and a clamping circuit, a bias current controller for controlling the bias current flowing in each operational amplifier with a predetermined timing, and a timing controller for controlling the changeover timing of the output switch.

9 Claims, 18 Drawing Sheets

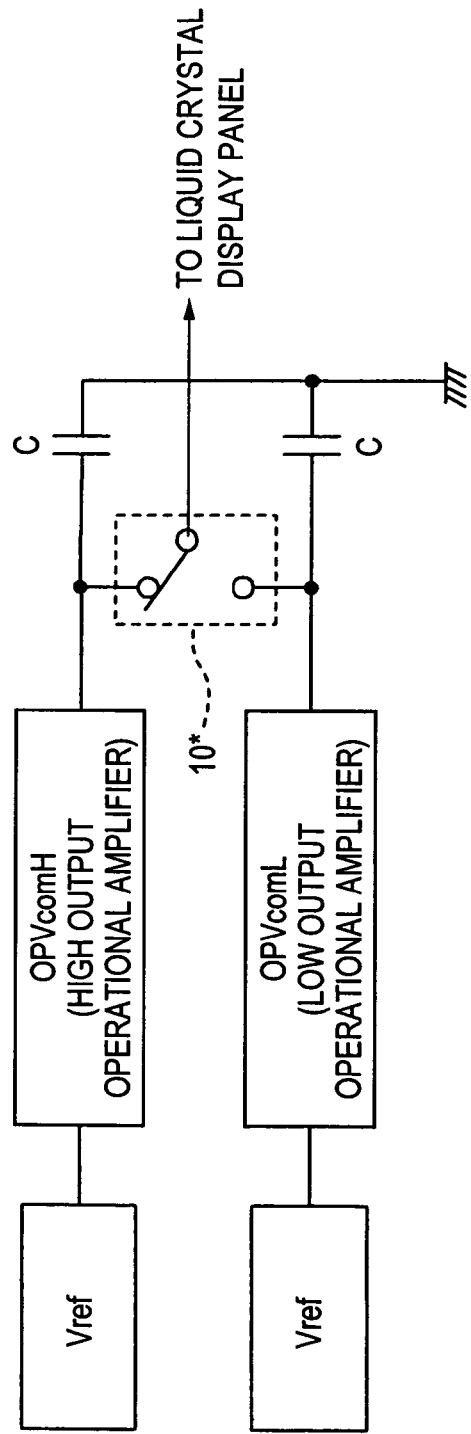

DRIVING VOLTAGE CONTROLLER

BACKGROUND OF THE INVENTION

1. Field of the Invention

The present invention relates to a driving voltage controller for controlling a driving voltage to drive a load such as a liquid crystal display panel by using an alternating current.

2. Description of the Related Art

FIG. 18 shows an example of a related art driving voltage controller for controlling a load such as a liquid crystal display panel. Thus, on a related art voltage controller are provided a High output operational amplifier OPVcomH and a Low output controller operational amplifier OPVcomL at the High/Low output of a power source generating a counter voltage Vref, as shown in FIG. 18. An output switch 10 of MOS transistors drives these operational amplifiers alternatively in order to supply an alternating voltage to a liquid crystal display panel.

An operational amplifier which is not connected to the liquid crystal display panel (hereinafter referred to as a "deselected operational amplifier") has different frequency compensating conditions between the panel-load conditions and the non-load conditions. Thus, an operational amplifier stable under the panel-load conditions could be unstable under the non-load conditions and oscillate in an unstable operation. To cope with this problem, the output of each operational amplifier is connected to a capacitor (stabilizing capacitance) C for stabilization purposes. In order to regulate the bias current source thereby reducing power consumption, a register (not shown) which can be set through a command sent from a CPU is internally provided. In the sleep or standby state, it is possible to change the setting of the register to shut down the operation of the operational amplifier, thus reducing the power consumption.

In the aforementioned related art driving voltage controller, the capacitor C is provided, which adds to the number of mounted components and the corresponding cost, as well as limits the mounting area of components. Typically, a capacitor becomes larger as its capacitance increases. Thus, a driving voltage controller has been in need which can supply an alternating voltage in a stable fashion free from oscillation of a deselected operational amplifier without the capacitor C.

The output switch 10 for switching between operational amplifiers preferably has no resistance. Increasing the W/L size ratio of the switch expands the capacity of the diffused section of the switch, which capacity acts as a load on the operational amplifier thus increasing the driving power and preventing a low-power design. The bias current flowing in an operational amplifier, determined by a value set to the register by the CPU considering the power supply capacity and power consumption, can be dynamically changed depending on the operating state of the operational amplifier.

SUMMARY OF THE INVENTION

The invention has been accomplished in view of the aforementioned related art problems and aims at providing a compact driving voltage controller which can be driven by a low power.

In order to solve the problems, a driving voltage controller according to the invention is a driving voltage controller for controlling a driving voltage to drive a load by using an alternating current, characterized in that the driving voltage controller comprises a High output operational amplifier for outputting a High driving voltage and a Low output operational amplifier for outputting a Low driving voltage, an output switch for alternating the connection of the load and the High output operational amplifier or the Low output operational amplifier with a predetermined timing, a timing controller for controlling the changeover timing of the output switch, and a bias current controller for controlling a bias current flowing in the High output operational amplifier and a bias current flowing in the Low output operational amplifier based on the changeover timing. In this way, by controlling the bias current flowing in an operational amplifier, it is possible to prevent oscillation in an operational amplifier which is not connected to a load thus reducing the power consumption. As a result, no capacitors (stabilizing capacitance) are necessary so that it is possible to reduce the footprint of the controller.

A driving voltage controller according to the invention is characterized in that the High output operational amplifier and the Low output operational amplifier each comprises a differential input stage and an output stage and that the bias current controller controls the bias current flowing in the High output operational amplifier and the Low output operational amplifier by reducing or interrupting the bias current flowing in the differential input stage. In this case, the bias current flows in the output stage. The output stage has a relatively large W/L size ratio in order to drive a large load such as a liquid crystal display panel or an output switch. As a result, the output transistor has a large parasitic capacitance. When the bias current flowing in the output stage is interrupted, recharging of the parasitic capacitance before normal operation takes time, thus reducing the operation speed of the controller. By reducing or interrupting only the bias current flowing in the differential input stage, the voltage gain of the operational amplifier is reduced and the frequency compensating conditions are stabilized thus suppressing oscillation.

A driving voltage controller according to the invention is characterized in that the High output operational amplifier and the Low output operational amplifier each comprises a differential input stage and an output stage and that the bias current controller controls the bias current flowing in the High output operational amplifier and the Low output operational amplifier by increasing the bias current flowing in the differential input stage. In this case, the bias current flows in the differential input stage. This avoids discharge of the parasitic capacitance of a circuit connected to the differential input stage. A transmission function of a two-stage operational amplifier operating with no load has two types of pole frequencies. The differential input stage determines a low pole frequency while the output stage determines a high pole frequency. Increasing the bias current in the output stage lowers the impedance of the output stage and shifts the high pole frequency to an even higher frequency range. This elevates the phase-varying frequency and the phase margin is enhanced according to the control theory thereby preventing oscillation.

A driving voltage controller according to the invention is characterized in that the High output operational amplifier and the Low output operational amplifier each comprises a differential input stage and an output stage and that the bias current controller controls the bias current flowing in the High output operational amplifier and the Low output operational amplifier by reducing or interrupting the bias current flowing in the differential input stage and the bias current flowing in the output stage. In this case, the parasitic capacitance of a load connected to each stage is discharged, with dramatically reduced power consumption.

A driving voltage controller according to the invention is characterized in that the timing controller controls the changeover timing of the output switch in making changeover of the switch with a predetermined output switch changeover period in which the load is connected to neither the High output operational amplifier nor the Low output operational amplifier. This prevents a short circuit at the output terminals of the operational amplifiers.

A driving voltage controller according to the invention is a driving voltage controller for controlling a driving voltage to drive a load by using an alternating current, characterized in that the driving voltage controller comprises a High output operational amplifier for outputting a High driving voltage and a Low output operational amplifier for outputting a Low driving voltage, each of the operational amplifiers having a phase compensating circuit comprising a plurality of CR circuits including a CR circuit to which phase compensating conditions can be set that oscillation does not take place even in the absence of a load, an output switch for alternating between the connection of the load and the High output operational amplifier or the Low output operational amplifier with a predetermined timing, a timing controller for controlling the changeover timing of the output switch, and a phase compensating circuit controller for controlling the phase compensating circuit so as to select a CR circuit to which phase compensating conditions can be set that oscillation does not take place from among the plurality of CR circuits in the phase compensating circuit based on the changeover timing of the operational amplifier to which a load is not connected.

A driving voltage controller according to the invention is a driving voltage controller for controlling a driving voltage to drive a load by using an alternating current, characterized in that the driving voltage controller comprises a High output operational amplifier and a Low output operational amplifier each comprising a differential input stage and an output stage for outputting a High driving voltage and a Low driving voltage respectively, a bias current controller for controlling a bias current flowing in the output stage of the High output operational amplifier and the Low output operational amplifier by interrupting the bias current for a predetermined period with a predetermined timing, and a timing controller for controlling the timing of controlling the bias current flowing in the bias current controller. Thus, it is not necessary to provide a switch for alternating between the connection of a load and an operational amplifier. This reduces the footprint of the controller. When the output is turned off, the operational amplifier does not serve as an amplification circuit and no longer oscillates.

A voltage converter according to the invention comprises a voltage source for generating a constant voltage, an operational amplifier including a variable resistor in its negative feedback circuit, the operational amplifier regulating the amplitude of the output voltage of the voltage source, and a current mirror circuit for converting the output voltage of the operational amplifier to a high voltage, characterized in that the operational amplifier is a low voltage operational amplifier comprising low withstand voltage transistors. The low voltage operational amplifier may comprise low withstand voltage transistors without a resistance component for a high withstand voltage necessary for a high withstand voltage transistor, so that its footprint is smaller and requires smaller power consumption than in a high voltage operational amplifier comprising high withstand transistors. This reduces the footprint and power consumption of the operational amplifier.

A voltage converter according to the invention is characterized in that the voltage converter comprises a clamping circuit for preventing an overvoltage from being applied to the transistor at the input of the current mirror circuit.

A driving voltage controller according to the invention comprises a voltage converter according to the invention, characterized in that the voltage converter applies an output voltage as a set voltage of at least either the High output operational amplifier or the Low output operational amplifier.

BRIEF DESCRIPTION OF THE DRAWINGS

FIG. 18 is a block diagram of a related art driving voltage controller.

Figure 1:
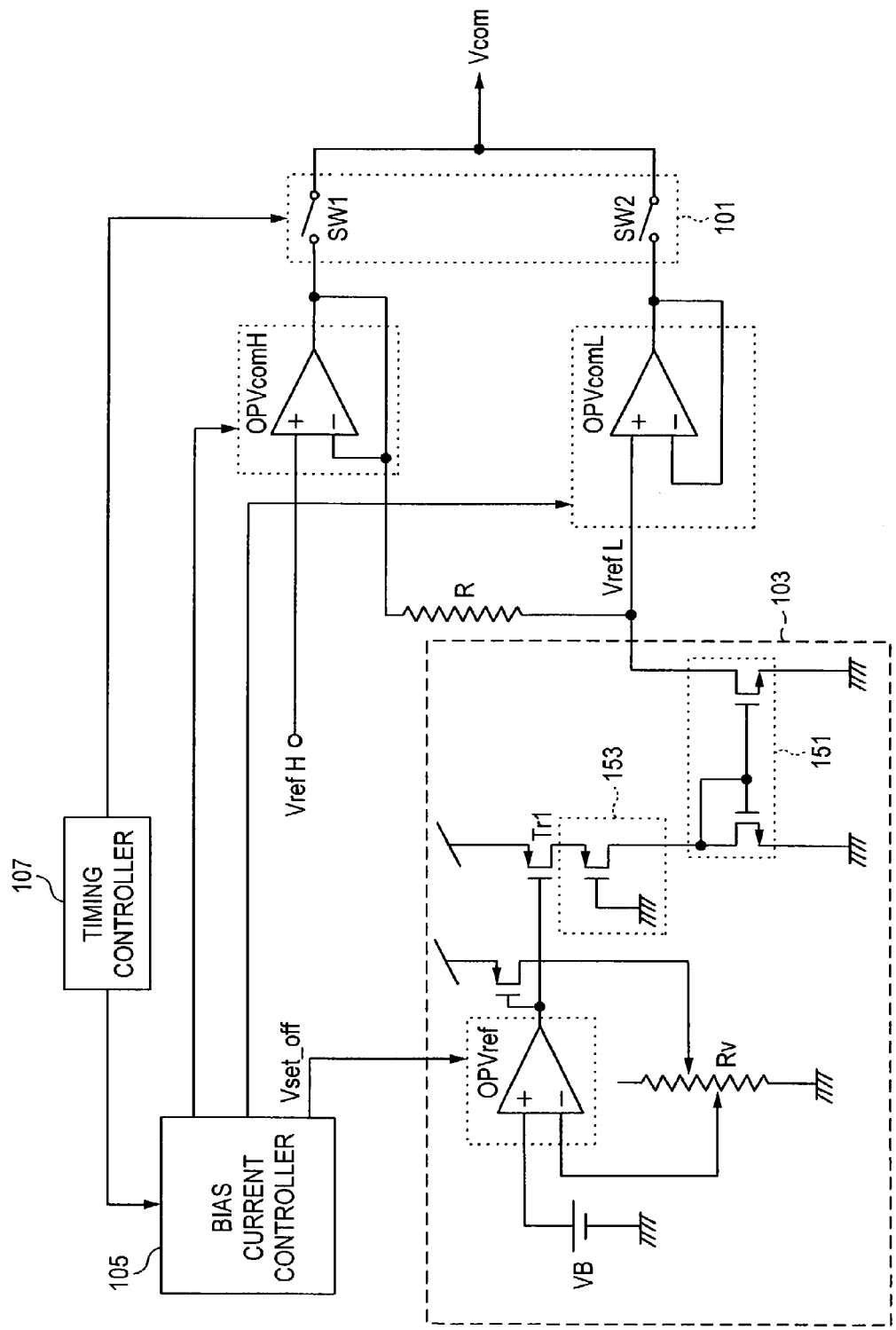
FIG. 1 is a circuit block diagram showing a driving voltage controller according to an embodiment of the invention.

In the figures, reference numeral 101, 101' each refers to output switch; 103, 103' to a set voltage generator; 105 to a bias current controller; 107 to a timing controller; 151 to a current mirror circuit; 153 to a clamping circuit; 201 to a differential input stage; 203 to an output stage; 301 to a bias current reducing circuit; 401 to a bias current increasing circuit; 501 to a bias current interrupting circuit; and 601 to a phase compensating circuit.

Additionally, in the figures, "OPVcomH" indicates a High output operational amplifier; "OPVcomL" indicates a Low output operational amplifier; "OPVcom" indicates a rail-to-rail input/output operational amplifier; "OPVrefL" indicates a voltage setting operational amplifier; "Rv" indicates a variable resistor; "SW1" and "SW2" each indicates a switch; "Tr1" and "Tr2" each indicates a Low withstand voltage transistor; and "VB" indicates a voltage source.

DETAILED DESCRIPTION OF THE PREFERRED EMBODIMENTS

An Embodiment of the invention according to the invention will be detailed below.

FIG. 1 is a circuit block diagram showing a driving voltage controller according to an embodiment of the invention. As shown in FIG. 1, a driving voltage controller according to this embodiment comprises an output switch 101, a High output operational amplifier OPVcomH, a Low output operational amplifier OPVcomL, a set voltage generator 103 serving as a voltage converter according to the invention, a bias current controller 105, and a timing controller 107. The controller connects the High output operational amplifier OPVcomH or Low output operational amplifier OPVcomL to a load such as a liquid crystal display panel by alternating the output switch 101 thus supplying a driving voltage (alternating voltage) to drive the load by using an alternating current.

Unlike the related art, while a driving voltage controller according to this embodiment does not comprise a capacitor (stabilizing capacitance) for preventing oscillation of an operational amplifier not connected to a load (hereinafter referred to as a "deselected operational amplifier"), it controls a bias current flowing in the deselected operational amplifier to reduce a voltage gain thus avoiding oscillation. In this embodiment, a set voltage VrefL applied to the non-inverted input terminal (positive terminal) of the Low output operational amplifier OPVcomL is supplied from the set voltage generator 103.

Components of a driving voltage controller according to this embodiment will be detailed.

The output switch 101 alternates between the output of the High output operational amplifier OPVcomH and the output of the Low output operational amplifier OPVcomL with a timing controlled by the timing controller 107. The output switch 101 comprises switches SW1 and SW2 including transfer gates. The output switch 101, when the switch SW1 is turned on and the switch SW2 is turned off, selects the High output operational amplifier OPVcomH to cause the controller to output a driving voltage VcomH. The output switch 101, when the switch SW2 is turned on and the switch SW1 is turned off, selects the High output operational amplifier OPVcomL to cause the controller to output a driving voltage VcomL. The output switch 101 comprising transfer gates has a low resistance (low impedance) by providing a large W/L ratio to assure high current output while it has a large parasitic capacitance.

Next, the High output operational amplifier OPVcomH and the Low output operational amplifier OPVcomL will be described. The High output operational amplifier OPVcomH and the Low output operational amplifier OPVcomL supply driving voltages VcomH and VcomL to a load such as a liquid crystal display panel and respectively connected to a negative feedback. A set voltage is allied to the non-reversed input terminal (positive terminal) of each operational amplifier. A set voltage VrefH and a set voltage VrefL are applied to the High output operational amplifier OPVcomH and the Low output operational amplifier OPVcomL respectively. The bias current flowing in each operational amplifier is controlled by a bias current controller 105. The timing of controlling the bias current is synchronized with the changeover timing of the output switch 101.

Figure 2A:
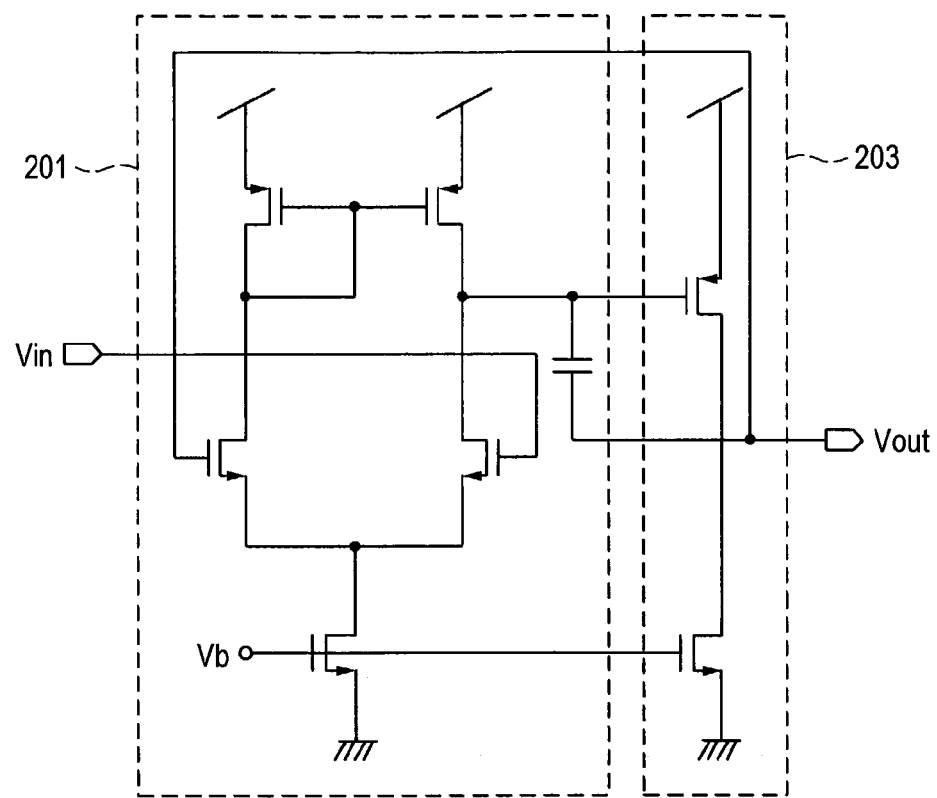
FIG. 2A is an internal circuit diagram of a High output operational amplifier OPVcomH.
Figure 2B:
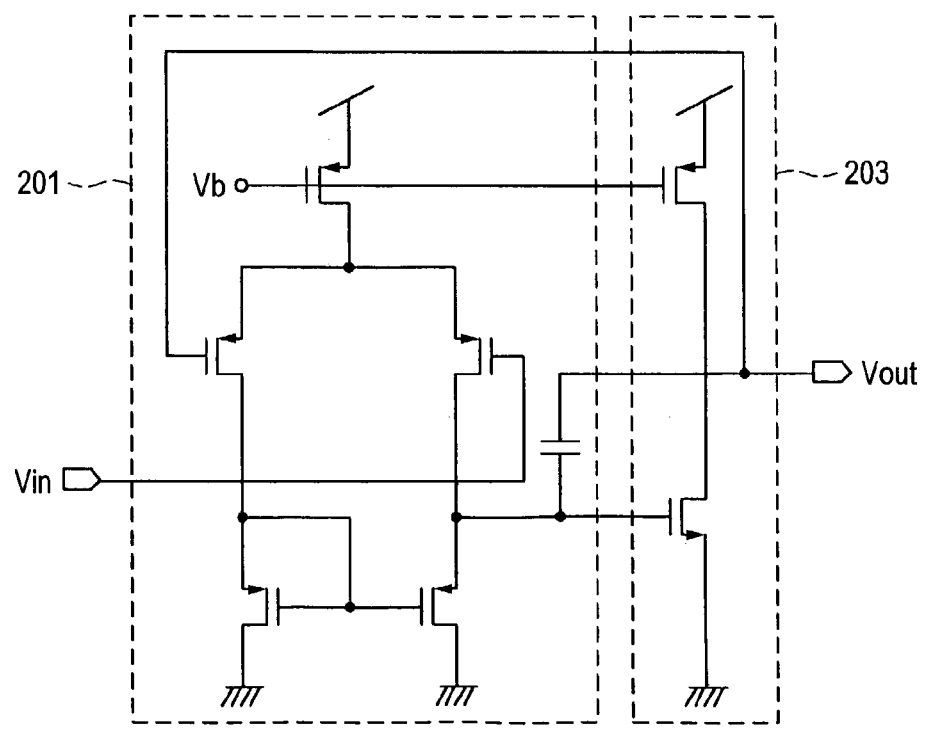
FIG. 2B is an internal circuit diagram of a Low output operational amplifier OPVcomL.

FIG. 2A is an internal circuit diagram of a High output operational amplifier OPVcomH. FIG. 2B is an internal circuit diagram of a Low output operational amplifier OPVcomL. Each operational amplifier is a high voltage operational amplifier comprising high withstand voltage transistors capable of supplying a voltage to a load which requires a relatively large driving voltage. To these operational amplifiers are applied high set voltages VrefH, VrefL so as to supply high driving voltages VcomH, VcomL. As shown in FIG. 2, each operational amplifier can be divided into a differential input stage 201 and an output stage 203. As shown in FIG. 1, the output switch comprising transfer gates is connected to the output stage 203. The set voltage generator 103 is connected to the differential input stage 201 of the Low output operational amplifier OPVcomL.

Next, the set voltage generator 103 will be described. The set voltage generator 103 comprises a voltage source VB, a Low voltage setting operational amplifier OPVref, a variable resistor Rv, a current mirror circuit comprising high withstand voltage transistors, a clamping circuit 153, and low withstand voltage transistors Tr1, Tr2. The set voltage generator 103 generates a set voltage VrefL to be supplied to the non-inverted input terminal (positive terminal) of the Low output operational amplifier OPVcomL.

The components of the set voltage generator 103 will be described. The voltage source VB supplies a reference voltage Vref which is lower than the set voltage VrefL applied to the Low output operational amplifier OPVcomL to the non-inverted input terminal (positive terminal) of the Low voltage setting operational amplifier OPVref. The Low voltage setting operational amplifier OPVref is connected to a negative feedback via the variable resistor Rv and regulates an output current depending on the resistance value of the variable resistor Rv.

In particular, as mentioned earlier, the reference voltage Vref generated by the voltage source VB is lower than the set voltage VrefL so that a Low voltage operational amplifier is used as a Low voltage setting operational amplifier OPVref. The low voltage operational amplifier can comprise low withstand voltage transistors which have no resistance components to prevent direct application of a high voltage in the channel area of a transistor so as to assure high withstand voltage necessary for a high withstand voltage transistor. The low voltage operational amplifier has a smaller footprint and lower power consumption than in a high voltage operational amplifier comprising high withstand voltage transistors such as a High output operational amplifier OPVcomH and a Low output operational amplifier OPVcomL.

The current mirror circuit 151 applies a set voltage VrefL to the non-inverted input terminal (positive terminal) of the Low output operational amplifier OPVcomL by propagating a current flowing in the transistor at an input to the transistor at an output and applying a current flowing in the transistor at the output to the resistor R. The multiplication ratio of voltage conversion can be adjusted by changing the resistance value through voltage division thus changing the ratio of multiplication. A low withstand voltage transistor is used as a transistor at the input of the current mirror circuit 151 while a high withstand voltage transistor is used as a transistor at the output of the current mirror circuit 151.

The clamping circuit 153 is a high withstand voltage transistor connected to the drain of the input transistor of the current mirror circuit 151. The gate of the clamping circuit 153 is grounded. The clamping circuit 153 lowers the drain voltage to the current mirror circuit 151 to prevent an overvoltage from being applied to a low withstand voltage transistor Tr1 on the clamping circuit 153.

Next, the bias current controller 105 will be described. The bias current controller 105 controls the bias controls the bias current flowing in the High output operational amplifier OPVcomH and the Low output operational amplifier OPVcomL based on a timing determined by the timing controller 107. The operational amplifier whose bias current is controlled is a deselected operational amplifier to which a load is not connected via the output switch 101. Unlike the related art, a driving voltage controller according to this embodiment does not comprise a capacitor (stabilizing capacitance) for preventing oscillation of an operational amplifier so that the driving voltage controller avoids oscillation of a deselected operational amplifier by controlling a bias current to reduce a voltage gain.

Control of a bias current will be detailed.

As mentioned earlier, the High output operational amplifier OPVcomH and the Low output operational amplifier OPVcomL each comprises a differential input stage and an output stage. The bias current 105 has three systems: (a) System where only the differential input stage is limited; (b) System where only the output stage is limited; and (c) System where both the differential input stage and the output stage are limited.

(a) System where only the differential input stage is limited

In this case, control is made to reduce or interrupt the bias current flowing in the differential input stage. In this practice, the bias current flows in the output stage. The output stage has a relatively large W/L size ratio in order to drive a large load such as a liquid crystal display panel or an output switch. As a result, the output transistor has a large parasitic capacitance. When the bias current flowing in the output stage is interrupted, recharging of the parasitic capacitance before normal operation takes time, thus reducing the operation speed of the controller. By reducing or interrupting only the bias current flowing in the differential input stage, the voltage gain of the operational amplifier is reduced and the frequency compensating conditions are stabilized thus suppressing oscillation.

Figure 3:
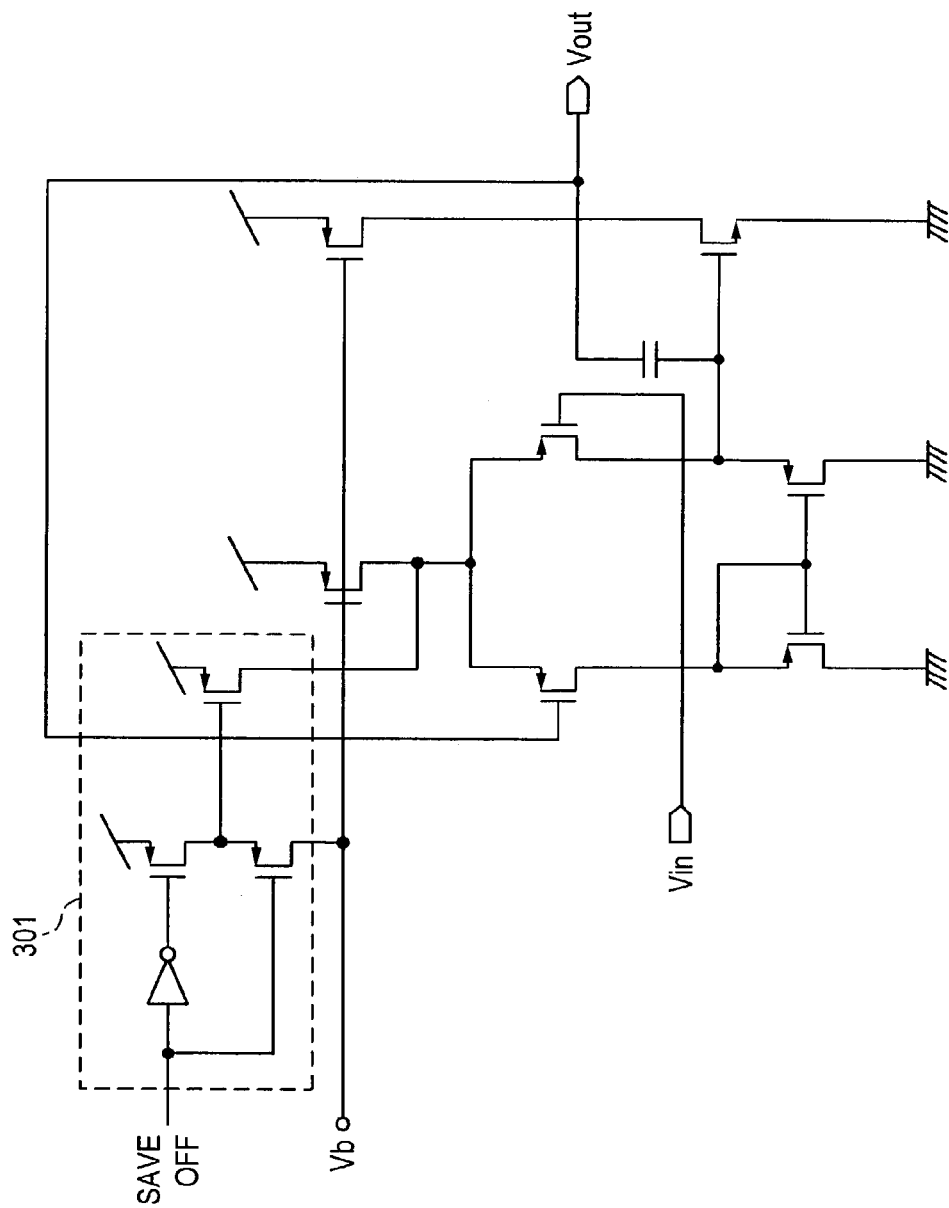
FIG. 3 is a circuit diagram of a Low output operational amplifier OPVcomL for implementing the system where only the differential input stage is limited.

FIG. 3 is a circuit diagram of a Low output operational amplifier OPVcomL for implementing the system. As shown in FIG. 3, the Low output operational amplifier OPVcomL comprises a bias current reducing circuit 301 in the differential input stage. The bias current reducing circuit 301 which comprises an inverter and a plurality of transistors reduces the bias current by way of a save signal sent from the bias current controller 105 and interrupts the bias current by way of an off signal sent from the bias current controller 105. The High output operational amplifier OPVcomH also comprises the bias current reducing circuit 301 in the differential input stage. A system is possible where the bias current is interrupted, not reduced, as well as a system where the bias current is reduced or interrupted.

(b) System where only the output stage is limited

In this case, control is made to increase the bias current flowing in the output stage. In this practice, the bias current flows in the differential input stage. This avoids discharge of the parasitic capacitance of the current mirror circuit 151 connected to the differential input stage. A transmission function of a two-stage operational amplifier operating with no load has two types of pole frequencies. The differential input stage determines a low pole frequency while the output stage determines a high pole frequency. Increasing the bias current in the output stage lowers the impedance of the output stage and shifts the high pole frequency to an even higher frequency range. This elevates the phase-varying frequency and the phase margin is enhanced according to the control theory thereby preventing oscillation. Note that the current mirror circuit 151 is an important load condition for determining the through rate of an operational amplifier, and that discharge of the current mirror circuit 151 limits the rise time and fall time at the start of operation.

Figure 4:
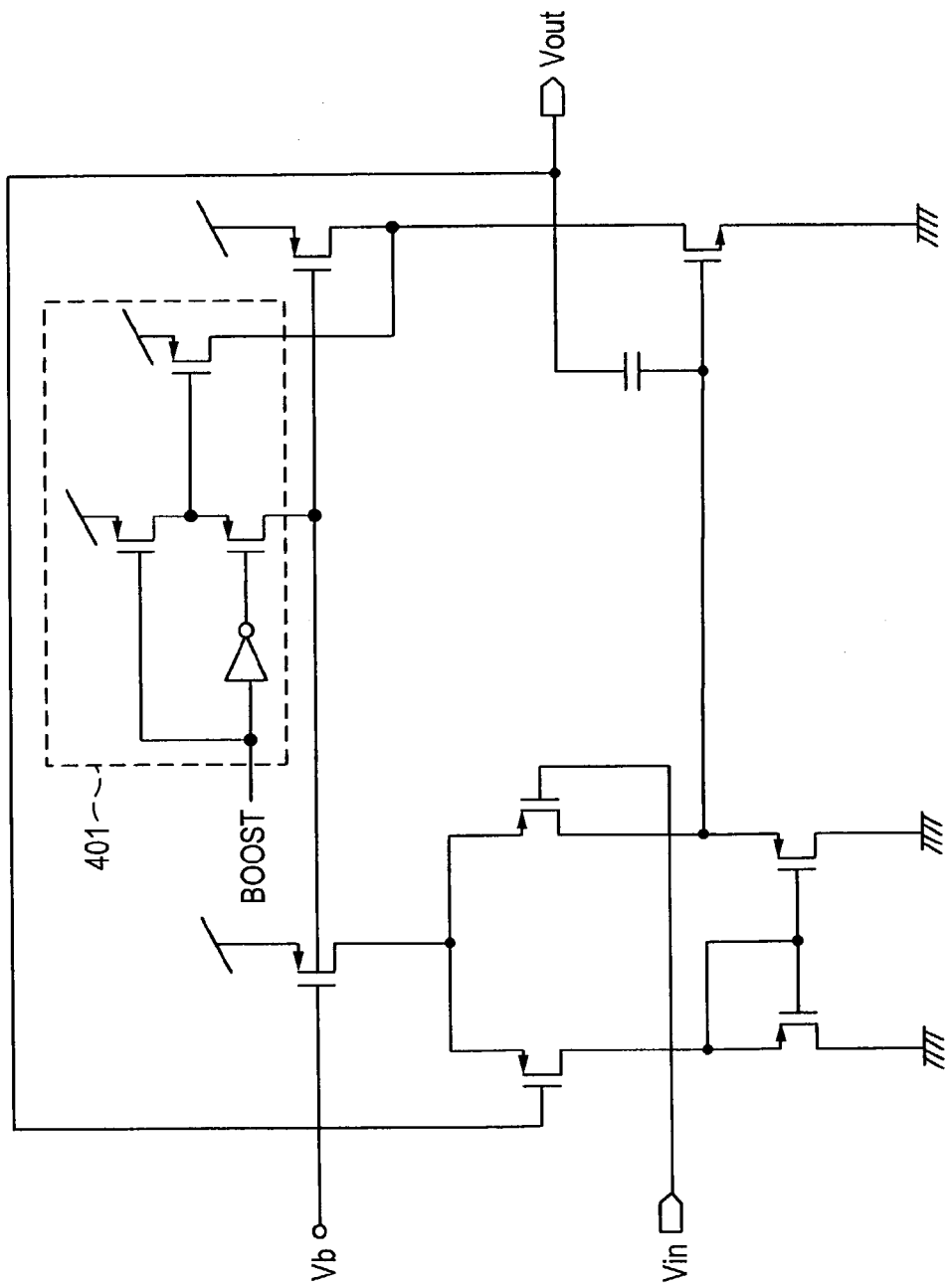
FIG. 4 is a circuit diagram of a Low output operational amplifier OPVcomL for implementing the system where only the output stage is limited.

FIG. 4 is a circuit diagram of a Low output operational amplifier OPVcomL for implementing the system. As shown in FIG. 4, the Low output operational amplifier OPVcomL comprises a bias current increasing circuit 401 in the output stage. The bias current increasing circuit 301 which comprises an inverter and a plurality of transistors increases the bias current by way of a boost signal sent from the bias current controller 105. The High output operational amplifier OPVcomH also comprises the bias current increasing circuit 401 in the output stage.

(c) System where both the differential input stage and the output stage are limited In this case, control is made to interrupt both the bias currents flowing in the differential input stage and the output stage. In this practice, the parasitic capacitance of a load connected to each stage is discharged but the effect of low power consumption is maximized. Thus, for a liquid crystal display panel with small resolution and low operation speed, the performance of power consumption and operation speed is maintained high.

Figure 5:
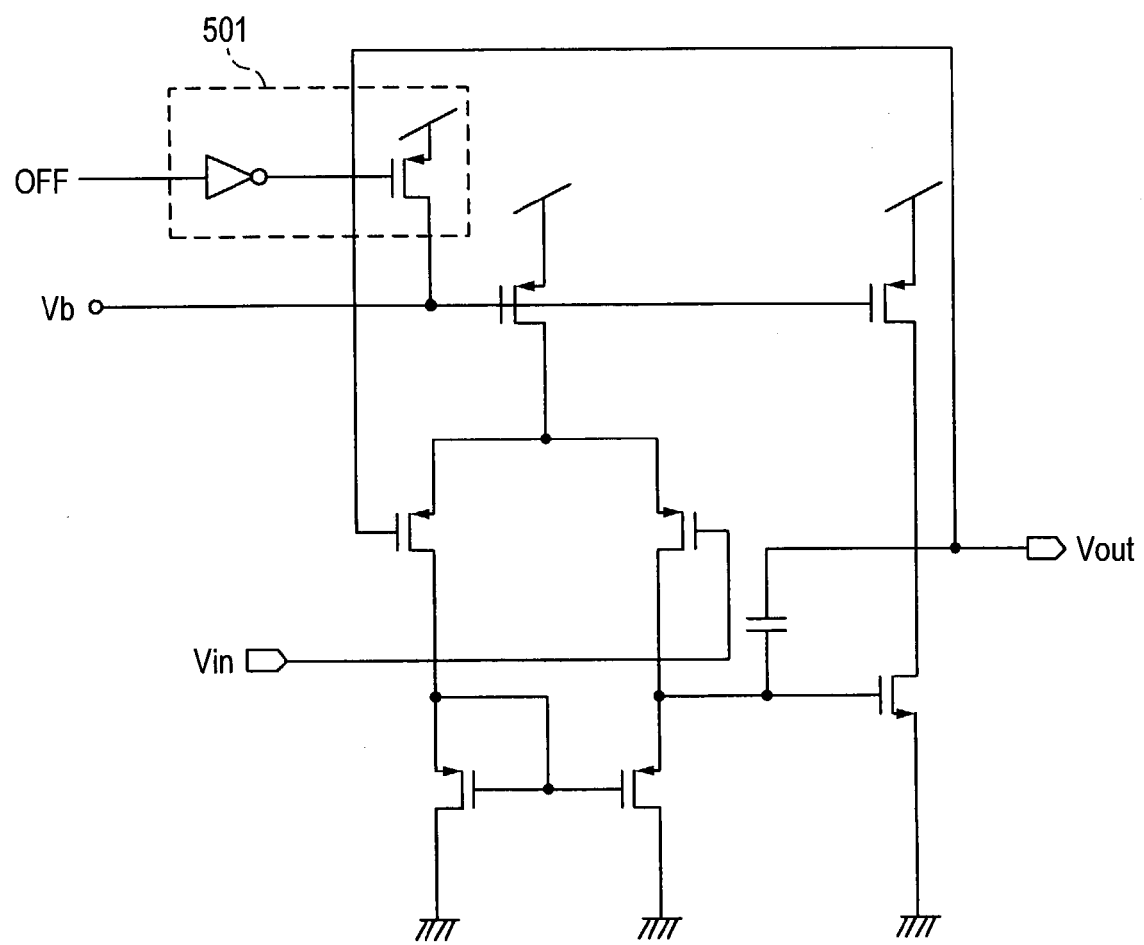
FIG. 5 is a circuit diagram of a Low output operational amplifier OPVcomL for implementing the system where both the differential input stage and the output stage are limited.

FIG. 5 is a circuit diagram of a Low output operational amplifier OPVcomL for implementing the system. As shown in FIG. 5, the Low output operational amplifier OPVcomL comprises a bias current interrupting circuit 501 in the differential input stage. The bias current interrupting circuit 501 which comprises an inverter and a plurality of transistors interrupts the bias current by way of an off signal sent from the bias current controller. The High output operational amplifier OPVcomH also comprises the bias current interrupting circuit 501 in the differential input stage. A system is possible where the bias current is reduced or interrupted, as well as a system where the bias current is interrupted, not reduced.

While the bias current flowing in the High output operational amplifier OPVcomH and the Low output operational amplifier OPVcomL is limited in the foregoing description, the bias current controller 105 can make control to interrupt the bias current flowing in the Low voltage setting operational amplifier OPVref in the set voltage generator 103.

When a cell phone equipped with a load such as a liquid crystal display panel has entered the standby mode or sleep mode, not only the High output operational amplifier OPVcomH and the Low output operational amplifier OPVcomL but also the Low voltage setting operational amplifier OPVref need not continue to operate. Thus, the bias current controller 105 interrupts the bias current flowing in the Low voltage setting operational amplifier OPVref by supplying a Vset#off signal to the Low voltage setting operational amplifier OPVref.

Next, the timing controller 107 will be described. The timing controller 107 controls the changeover timing of the output switch 101 for alternating between the output of the High output operational amplifier OPVcomH and the output of the Low output operational amplifier OPVcomL. Setting of the changeover timing is made in accordance with a signal from register setting means or an external signal. The timing set by the timing controller 107 is communicated to the bias current controller 105.

Operation of a driving voltage controller according to this embodiment which is driven with a timing determined by the timing controller 107 will be detailed. The High output operational amplifier OPVcomH and the Low output operational amplifier OPVcomL may be in a "normal mode" where a non-regulated bias current flows, a "reduction mode" where a reduced bias current flows, or an "off mode" where the bias current is interrupted.

Figure 6:
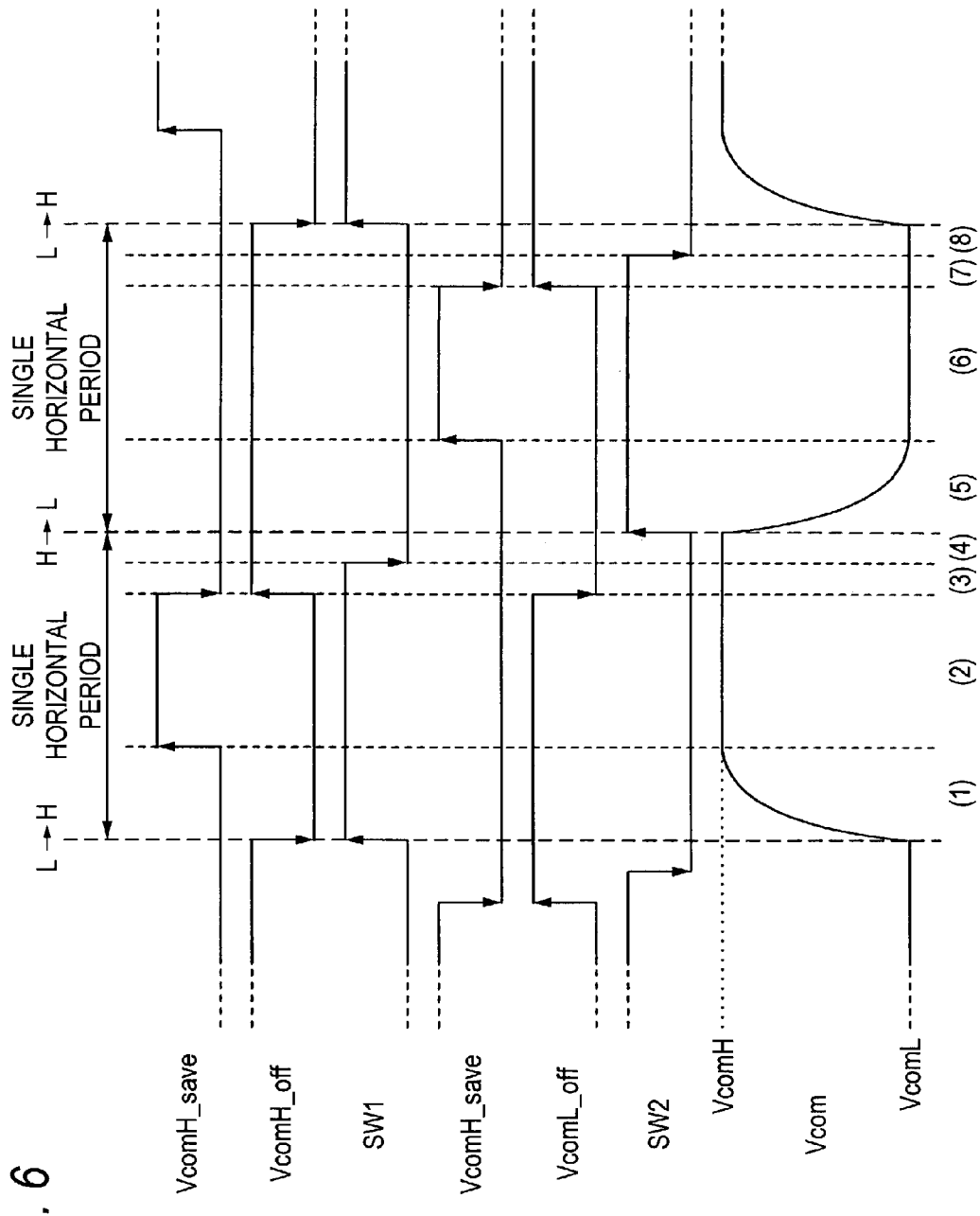
FIG. 6 is a timing chart assumed when the normal mode, reduction mode and off mode are employed.

Operation of the changeover of the output switch from the Low output operational amplifier OPVcomL to the High output operational amplifier OPVcomH and from the High output operational amplifier OPVcomH to the Low output operational amplifier OPVcomL, and the timing of a signal sent from the bias current controller 105 and the driving voltage Vcom will be described referring to FIG. 6. As shown in FIG. 6, when the output switch 101 is placed in the position of the High output operational amplifier OPVcomH while a load is connected to the Low output operational amplifier OPVcomL, that is, when the switch SW1 is turned on, the bias current controller 105 interrupts an off signal sent to the High output operational amplifier OPVcomH, so that the driving voltage Vcom makes a shift from VcomL to VcomH and the High output operational amplifier OPVcomH enters the (1) normal mode.

The bias current controller 105 sends a save signal to the High output operational amplifier OPVcomH after a predetermined time when the driving voltage reaches the VcomH level. A bias current IbH flowing in the High output operational amplifier OPVcomH is reduced and the High output operational amplifier OPVcomH enters the (2) reduction mode. The driving voltage Vcom stays at the VcomH level. After a predetermined time, the controller 105 stops sending of a save signal to the High output operational amplifier OPVcomH and starts sending an off signal. The bias current IbH is interrupted and the High output operational amplifier OPVcomH enters the (3) off mode. Even in the off mode, the load capacitance and the parasitic capacitance connected to the output terminal maintains the output voltage so that the driving voltage remains VcomH. At the same time the off signal is sent to the High output operational amplifier OPVcomH, the bias current controller 105 stops sending of the off signal to the Low output operational amplifier OPVcomL.

When the High output operational amplifier OPVcomH enters the off mode, a switch SW1 is turned off. When a predetermined output switch changeover period (4) has elapsed, a switch SW2 is turned on. The period from turning on of the switch SW1 to turning on of the switch SW2 is a single horizontal period. Once the switch SW1 is turned off, the operational amplifier OPVcomH may enter the off mode before the switch SW2 is turned on.

When the switch SW2 is turned on, the driving voltage Vcom makes a transition from VcomH to VcomL and the Low output operational amplifier OPVcomL enters the (5) normal mode. The bias current controller 105 sends a save signal to the Low output operational amplifier OPVcomL after a predetermined time when the driving voltage reaches the VcomL level. A bias current IbL flowing in the Low output operational amplifier OPVcomL is reduced and the Low output operational amplifier OPVcomL enters the (6) reduction mode, and the driving voltage Vcom stays at the VcomL level.

Then, after a predetermined time, the bias current controller 105 stops sending of the save signal to the Low output operational amplifier OPVcomL and starts sending the off signal. The bias current IbL is interrupted and the Low output operational amplifier OPVcomL enters the (7) off mode. Even in the off mode, the driving voltage remains VcomL. At the same time the off signal is sent to the Low output operational amplifier OPVcomL, the bias current controller 105 stops sending of the off signal to the High output operational amplifier OPVcomH.

When the Low output operational amplifier OPVcomL enters the off mode, the switch SW2 is turned off. When a predetermined output switch changeover period (8) has elapsed, the switch SW2 is turned on. The period from turning on of the switch SW2 to turning on of the switch SW1 is a single horizontal period.

In this way, the High output operational amplifier OPVcomH and the Low output operational amplifier OPVcomL enters the normal mode, reduction mode and off mode for a single horizontal period in intervals of a single horizontal period. The driving voltage controller according to the embodiment supplies a driving voltage VcomH or VcomL to a load in units of a single horizontal period. The output switch changeover periods (4), (8) are provided to prevent short circuit of the output terminals of the operational amplifiers OPVcomH, OPVcomL.

Figure 7:
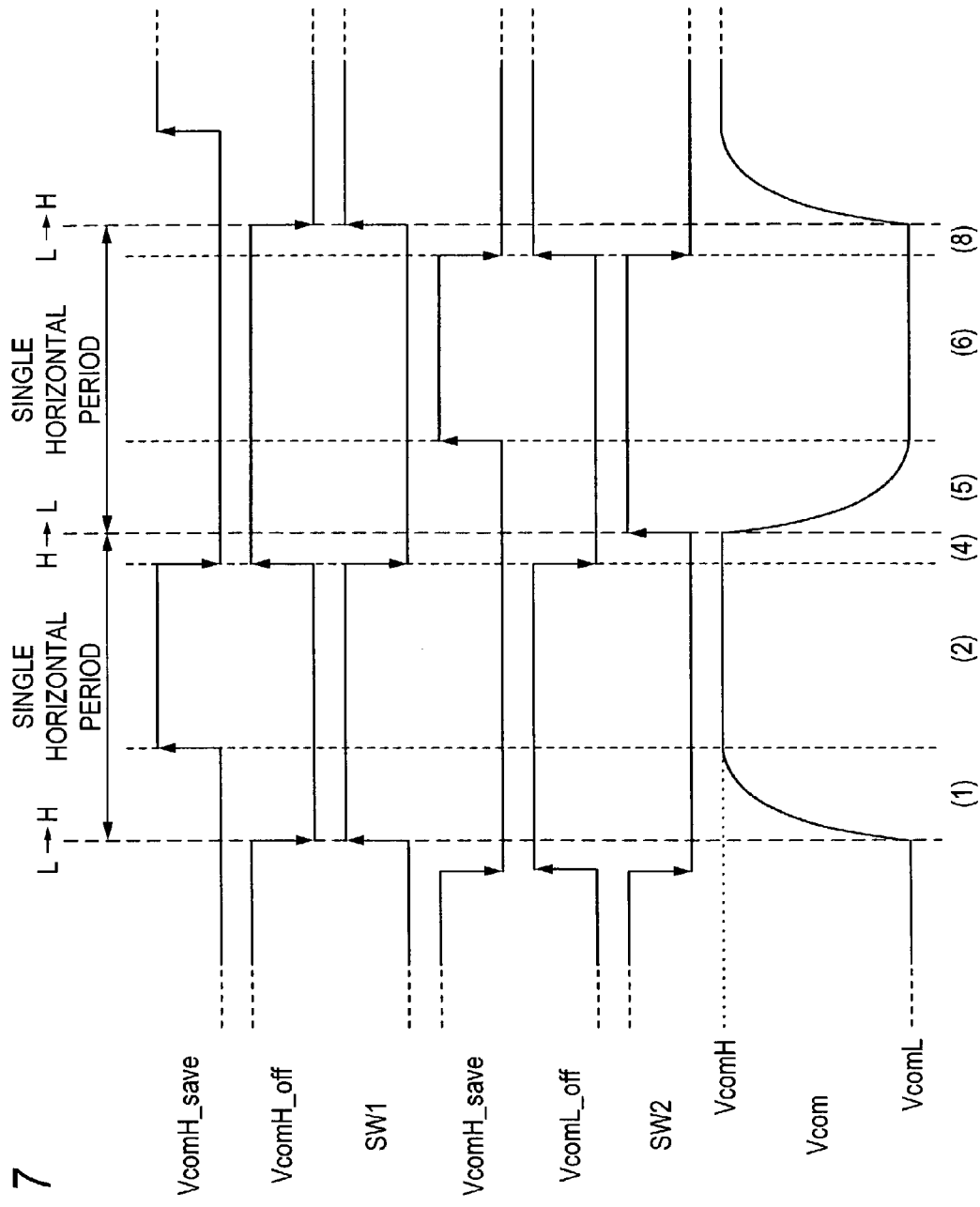
FIG. 7 is a timing chart assumed when the normal mode and reduction mode are employed.
Figure 8:
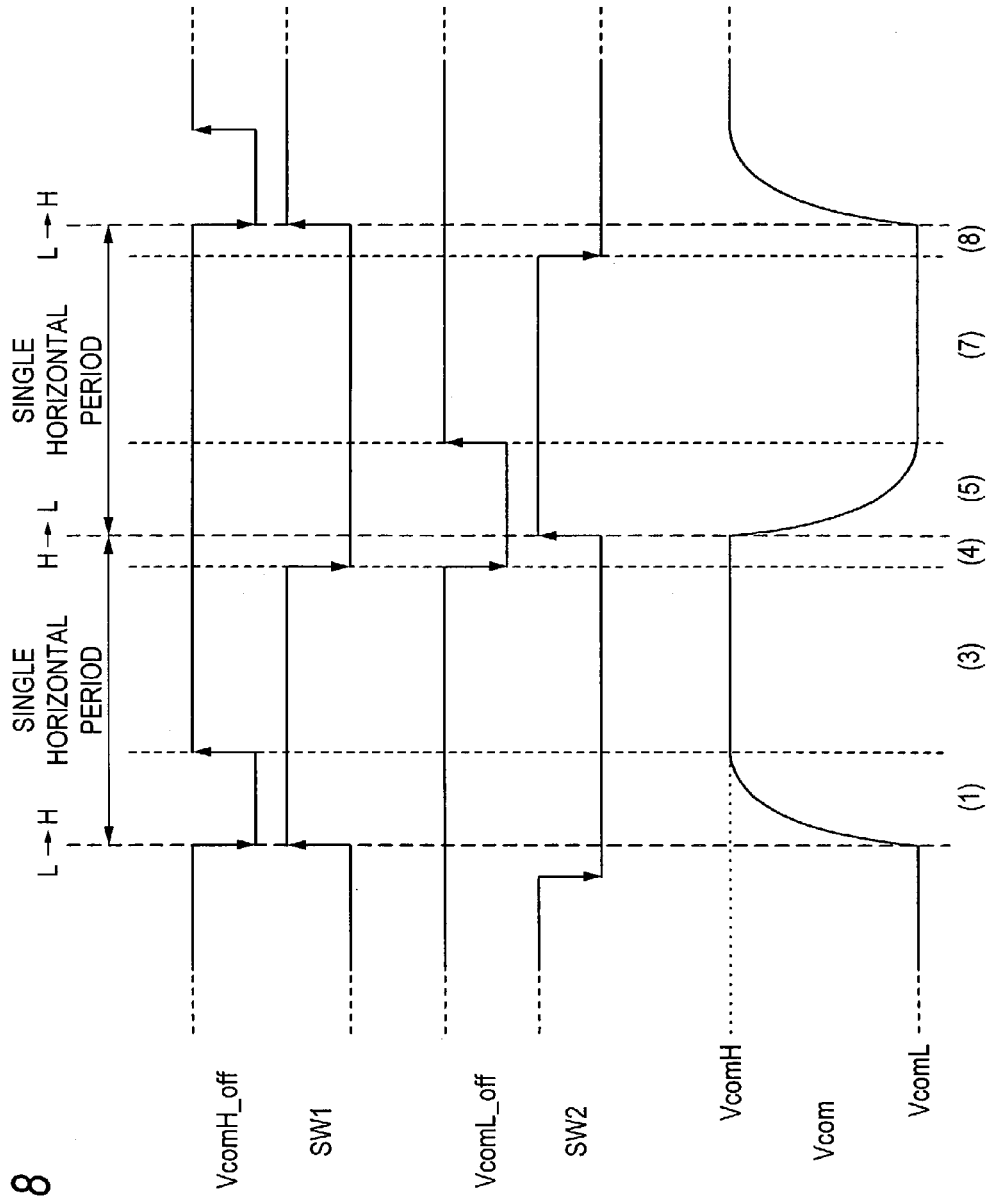
FIG. 8 is a timing chart assumed when the normal mode and off mode are employed.
Figure 9:
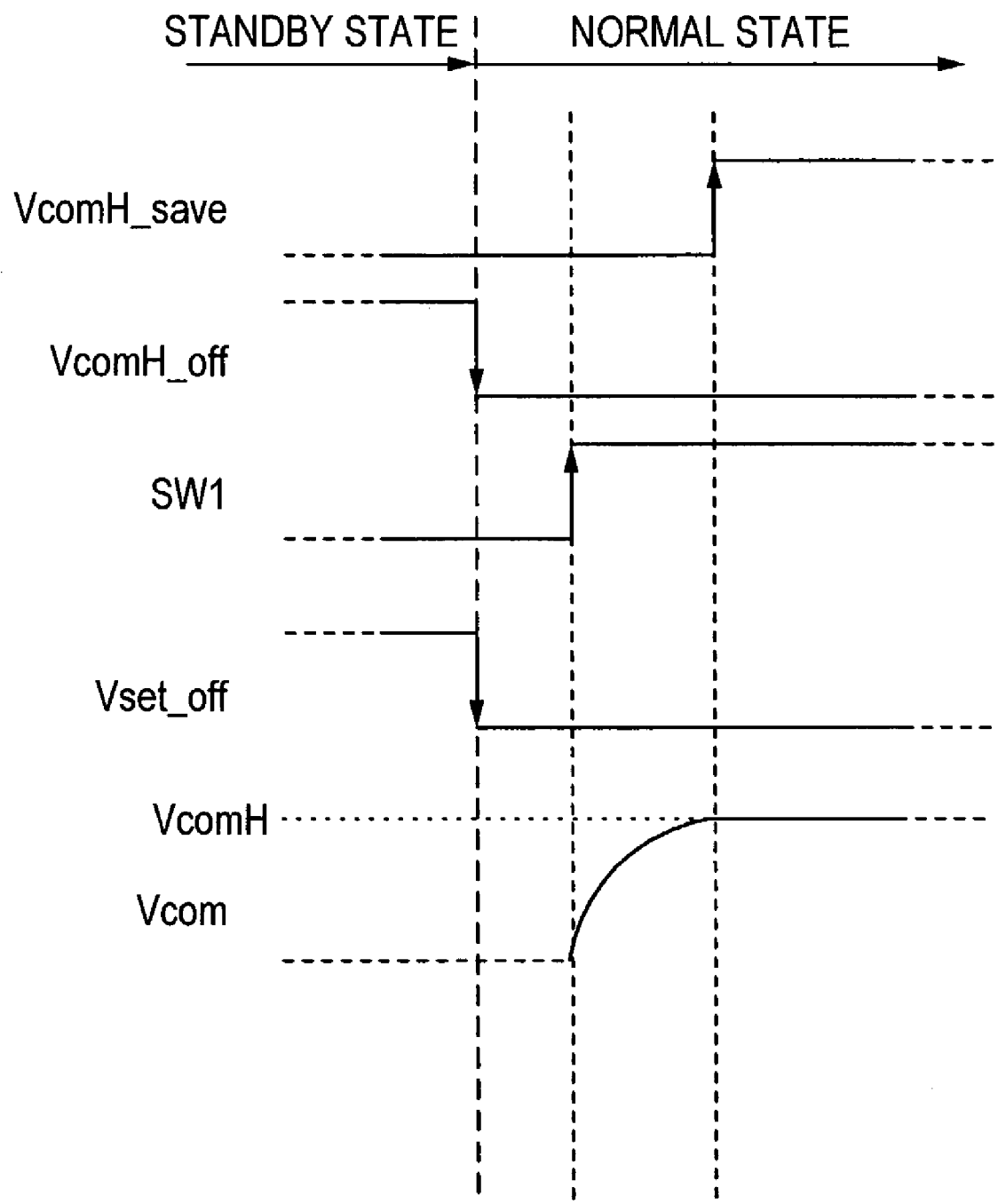
FIG. 9 is a timing chart showing a transition from the standby mode to the normal mode.

While each operational amplifier enters the normal mode, reduction mode or off mode in the foregoing description, two modes, normal mode and reduction mode, or normal mode and off mode may be employed instead. FIG. 7 is a timing chart assumed when the normal mode and reduction mode are employed. FIG. 8 is a timing chart assumed when the normal mode and off mode are employed. When a cell phone equipped with a load such as a liquid crystal display panel makes a transition from the standby mode or sleep mode to the normal mode, the bias current controller 105 must drive the Low voltage setting operational amplifier OPVref in the set voltage generator 103. FIG. 9 is a timing chart showing a transition from the standby mode to the normal mode.

As mentioned earlier, a driving voltage controller according to this embodiment makes control to suppress oscillation of a deselected operational amplifier by limiting the bias current in order to assure stable operation of the deselected operational amplifier to which a load such as a liquid crystal display panel is not connected. This eliminates the need for a capacitor (stabilizing capacitance) to prevent oscillation in the related art. As a result, the footprint of the controller is reduced and the power consumption is reduced by controlling, that is, reducing/interrupting the bias current.

The set voltage generator 103 for supplying a set voltage VcomL to the Low output operational amplifier OPVcomL generates the set voltage VcomL by converting a low reference voltage Vref to a high voltage in the current mirror circuit 151. Thus the Low voltage setting operational amplifier OPVref before the current mirror circuit 151 may be a low voltage operational amplifier. The low voltage operational amplifier may comprise low withstand voltage transistors without a resistance component for a high withstand voltage necessary for a high withstand voltage transistor, so that its footprint is smaller and requires smaller power consumption than in a high voltage operational amplifier comprising high withstand transistors. This reduces the footprint and power consumption of the set voltage generator 103, or driving voltage controller according to this embodiment.

Embodiments other than the aforementioned embodiment will be described.

Figure 10:
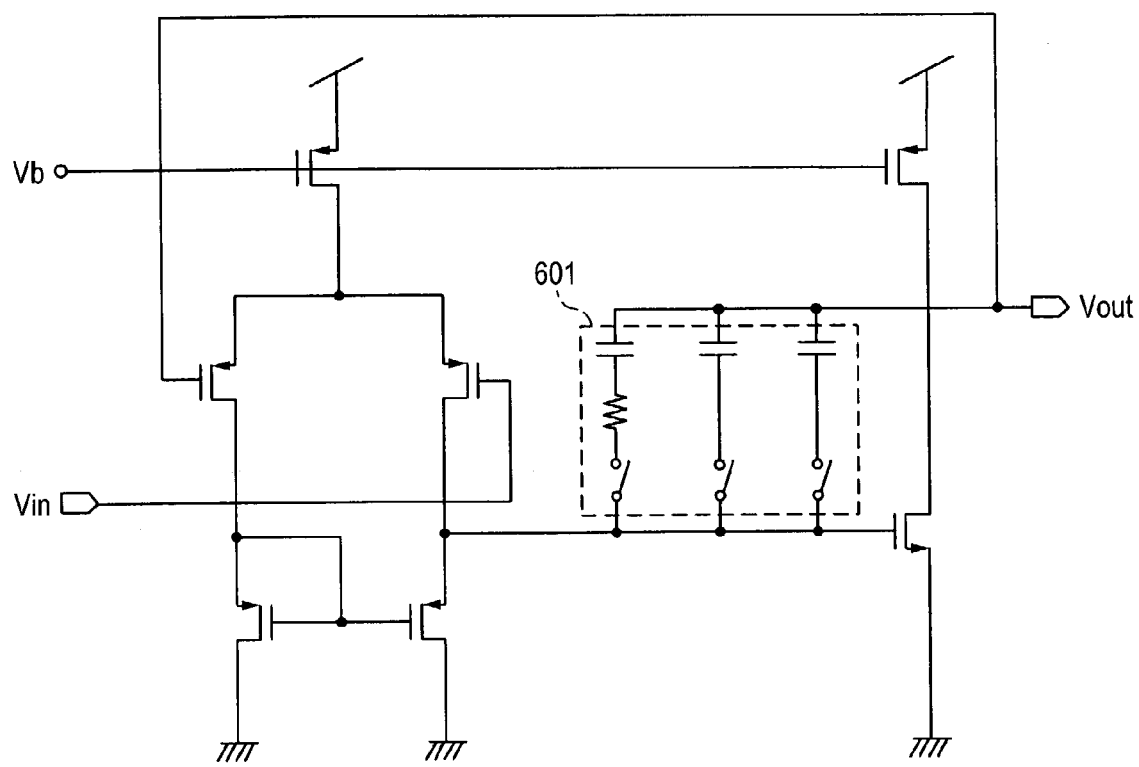
FIG. 10 is an internal circuit diagram of a Low output operational amplifier OPVcomL where a phase compensating circuit is incorporated.

While the bias current is controlled on a deselected operational amplifier to which a load is not connected so that the operational amplifier will not oscillate in order to assure stable operation of the deselected operational amplifier, a phase compensating circuit may be provided in each operational amplifier to stabilize the operation of the deselected operational amplifier as an alternative embodiment. FIG. 10 is an internal circuit diagram of a Low output operational amplifier OPVcomL where a phase compensating circuit is incorporated. As shown in FIG. 10, a phase compensating circuit 601 comprises a plurality of CR circuits. At least one of the CR circuits of the phase compensating circuit 601 is designed to provide an output impedance free from oscillation of the operational amplifier even when a load is not connected to the operational amplifier.

In this case, a bias current controller 105 serving as a phase compensating circuit controller according to the invention changes over the CR circuits in the phase compensating circuit 601 provided in each operational amplifier OPVcomH, OPVcomL based on a timing determined by a timing controller 107 and sets to the deselected operational amplifier phase compensating conditions that oscillation does not take place even in the absence of a load. For example, in case a liquid crystal display panel having a relatively large capacitance value is driven, the load has a pole frequency whose frequency response is determined by the load capacitance of the liquid crystal display panel, so that the phase compensating circuit 601 of the operational amplifier does not need a phase compensating capacitance. In case a load is not connected, only a parasitic capacitance is connected to the operational amplifier. Thus, a phase compensating capacitance to create a dominant pole frequency is to be connected to the operational amplifier.

Figure 11A:
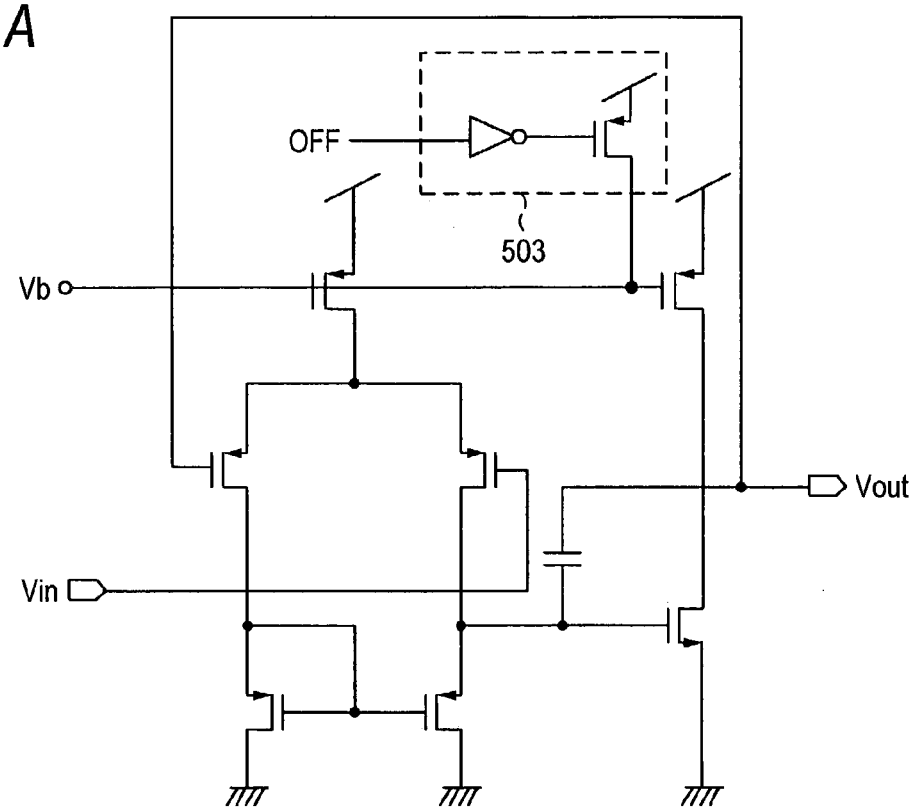
FIG. 11A is an internal circuit diagram of a High output operational amplifier OPVcomH where a high output impedance may be set.
Figure 11B:
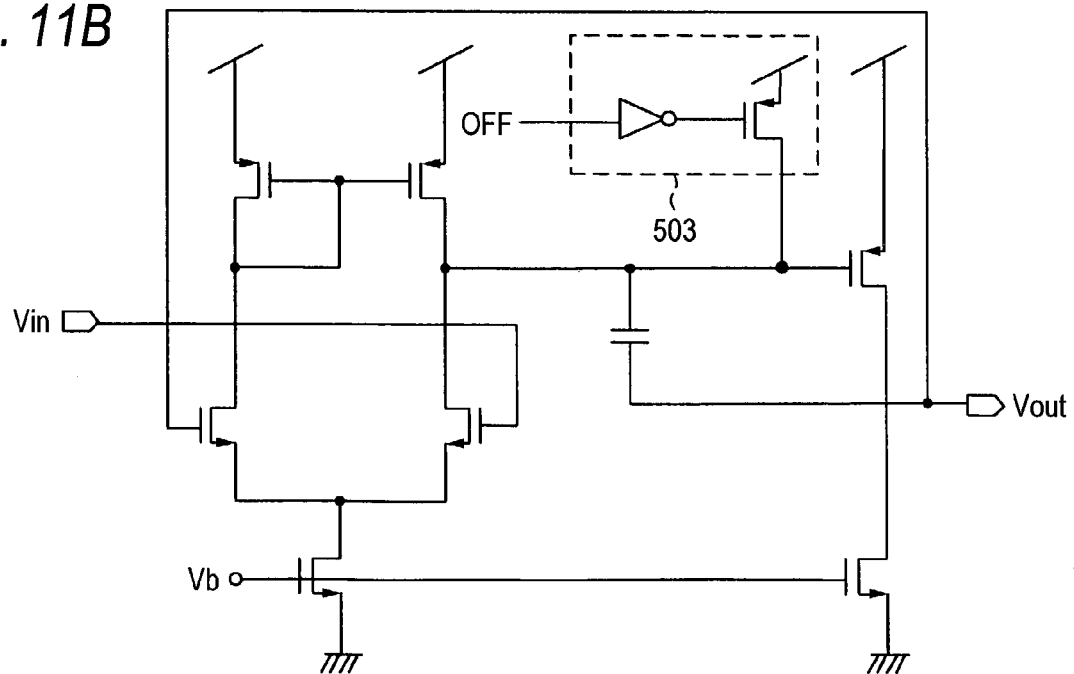
FIG. 11B is an internal circuit diagram of a Low output operational amplifier OPVcomL where a high output impedance may be set.

While the output switch 101 alternates between the two operational amplifiers OPVcomH and OPVcomL, these operational amplifiers may be changed over by interrupting a bias current flowing in the output stage of each operational amplifier to increase the output impedance as an alternative embodiment. FIG. 11A is an internal circuit diagram of a High output operational amplifier OPVcomH where this feature may be implemented. FIG. 11B is an internal circuit diagram of a Low output operational amplifier OPVcomL where this feature may be implemented. As shown in FIG. 11, each operational amplifier OPVcomH, OPVcomL comprises a circuit 503 in the output stage similar to the bias current interrupting circuit 501 shown in FIG. 5. The circuit 503 operates to interrupt the bias current by way of an off signal sent from the bias current controller 105.

According to the alternative embodiment, the switch 101 is not required so that the overall footprint is reduced. Each operational amplifier can reduce the power consumption to drive the parasitic capacitance of the output switch 101 and can shorten the output convergence time by reducing the serial resistance component generated by the presence of an output impedance. When the output is turned off, the operational amplifier does not serve as an amplification circuit and no longer oscillates.

Figure 12A:
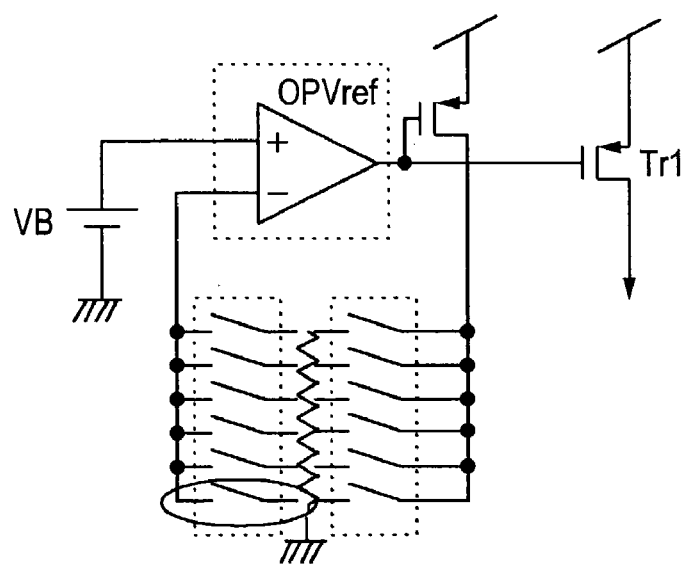
FIGS. 12A, 12B, 12C are circuit diagrams of a Low voltage setting operational amplifier OPVref of the configuration and its periphery according to the alternative embodiment.
Figure 12B:
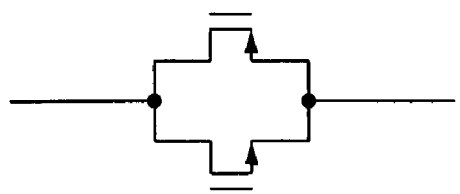
Figure 12C:
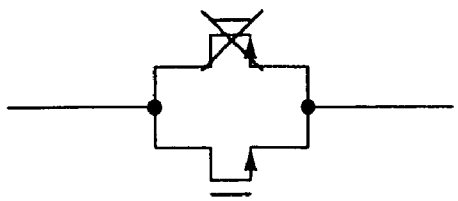

While a variable resistor Rv is included in the negative feedback circuit in the Low voltage setting operational amplifier OPVref in the set voltage generator 103 in this embodiment, a selector switch may be employed to select a resistance value as an alternative embodiment. FIGS. 12A, 12B, 12C are circuit diagrams of a Low voltage setting operational amplifier OPVref of the configuration and its periphery according to the alternative embodiment. The basic design of each selector switch is based on a CMOS technology where p-channel and n-channel transistors are connected in parallel, as shown in FIG. 12B. The voltage applied to the negative feedback circuit is approximately the same as the reference voltage Vref and the reference voltage Vref is a low voltage. Thus, each switch may be designed for a single channel alone, such as an n-channel, as shown in FIG. 12C. This reduces the footprint of the selector switch and power consumption of the selector switch.

Figure 13:
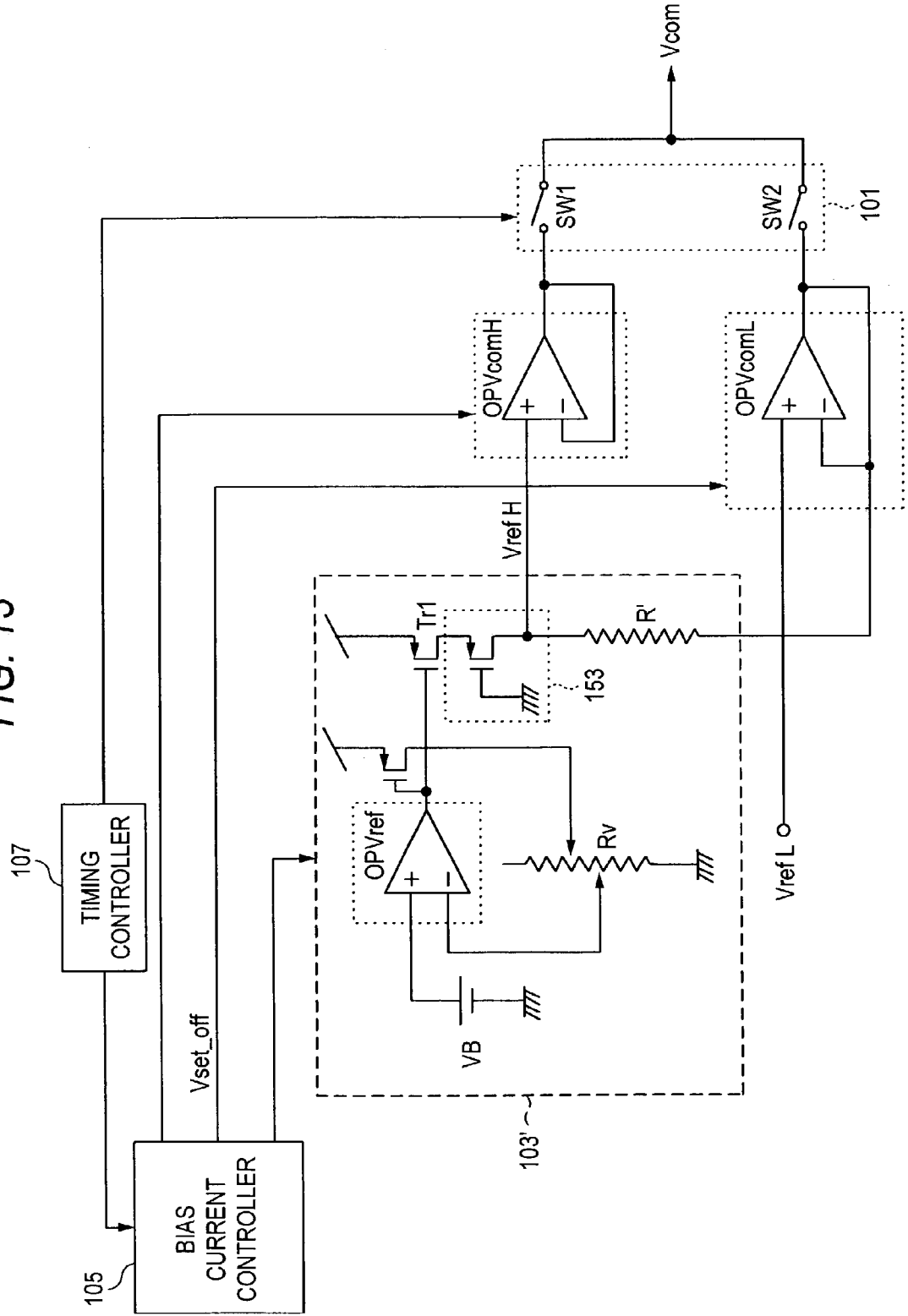
FIG. 13 is a circuit block diagram of a driving voltage controller comprising a set voltage generator on the High output operational amplifier OPVcomH.
Figure 14:
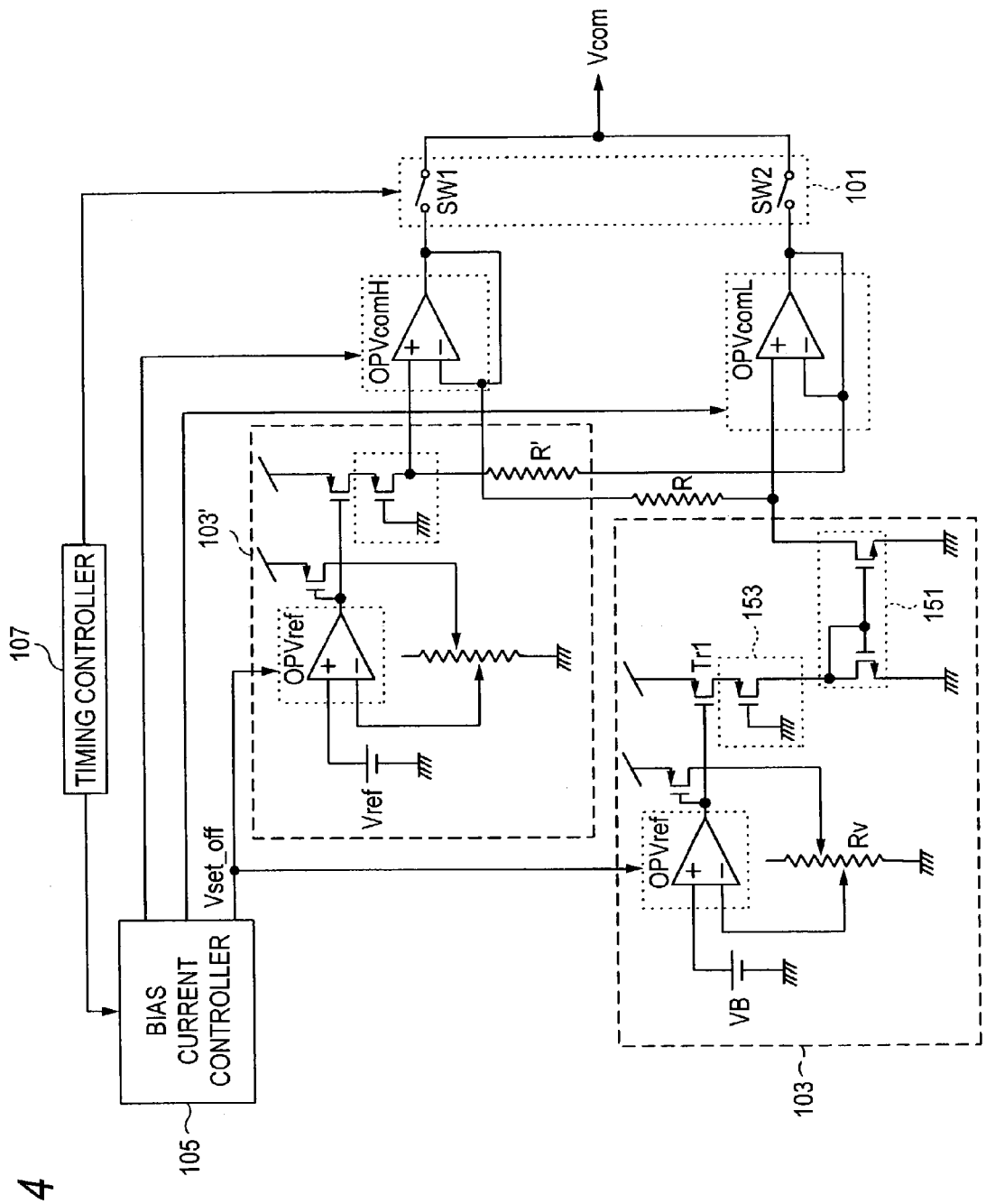
FIG. 14 is a circuit block diagram of a driving voltage controller comprising a set voltage generator 103 on the Low output operational amplifier OPVcomL and a set voltage generator 103' on the High output operational amplifier OPVcomH.

While the set voltage generator 103 generates a set voltage VrefL to be supplied to the Low output operational amplifier OPVcomL, the set voltage generator 103 may generate a set voltage VrefH to be supplied to the High output operational amplifier OPVcomH. FIG. 13 shows a driving voltage controller comprising a set voltage generator on the High output operational amplifier OPVcomH. As shown in FIG. 13, the set voltage generator 103' of the driving voltage controller does not comprise a current mirror circuit 151 so that the set voltage VrefH is supplied from the drain of a clamping circuit 153. As shown in FIG. 14, the set voltage generator 103 may be provided on the Low output operational amplifier OPVcomL and the set voltage generator 103' may be provided on the High output operational amplifier OPVcomH.

Figure 15:
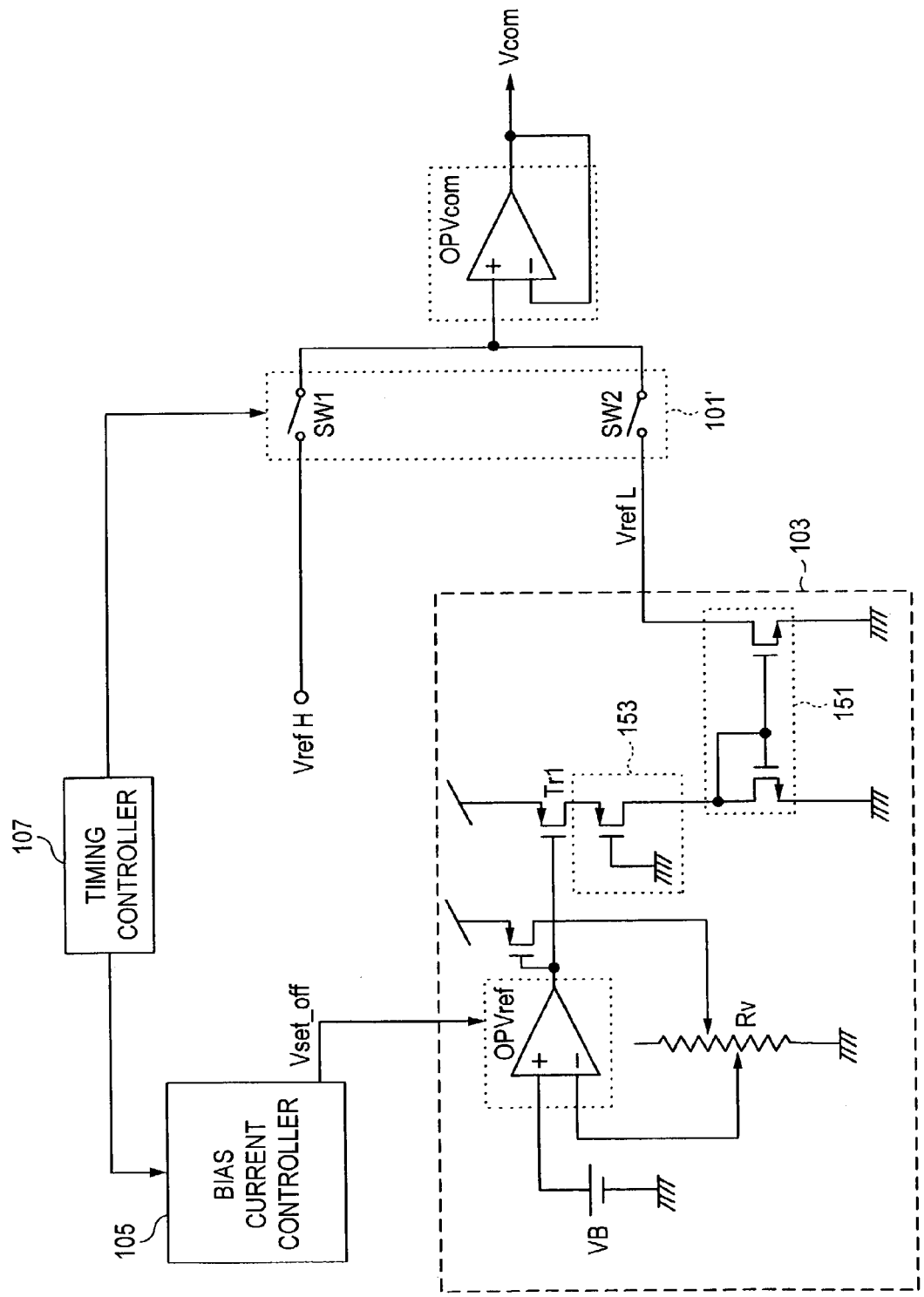
FIG. 15 is a circuit block diagram of a driving voltage controller comprising a single operational amplifier.

While a driving voltage controller according to this embodiment comprises two operational amplifiers OPVcomH, OPVcomL, a single operational amplifier may be employed as an alternative embodiment. FIG. 15 is a circuit block diagram of a driving voltage controller comprising a single operational amplifier. As shown in FIG. 15, the driving voltage controller comprises an operational amplifier OPVcom with a high withstand voltage and a rail-to-rail input/output, and an output switch 101' to alternate between the set voltages supplied to the non-inverted input terminal (positive terminal) of the OPVcom at the input of the operational amplifier OPVcom. In this way, a single operational amplifier is made unnecessary thus reducing the footprint of the controller.

Figure 16:
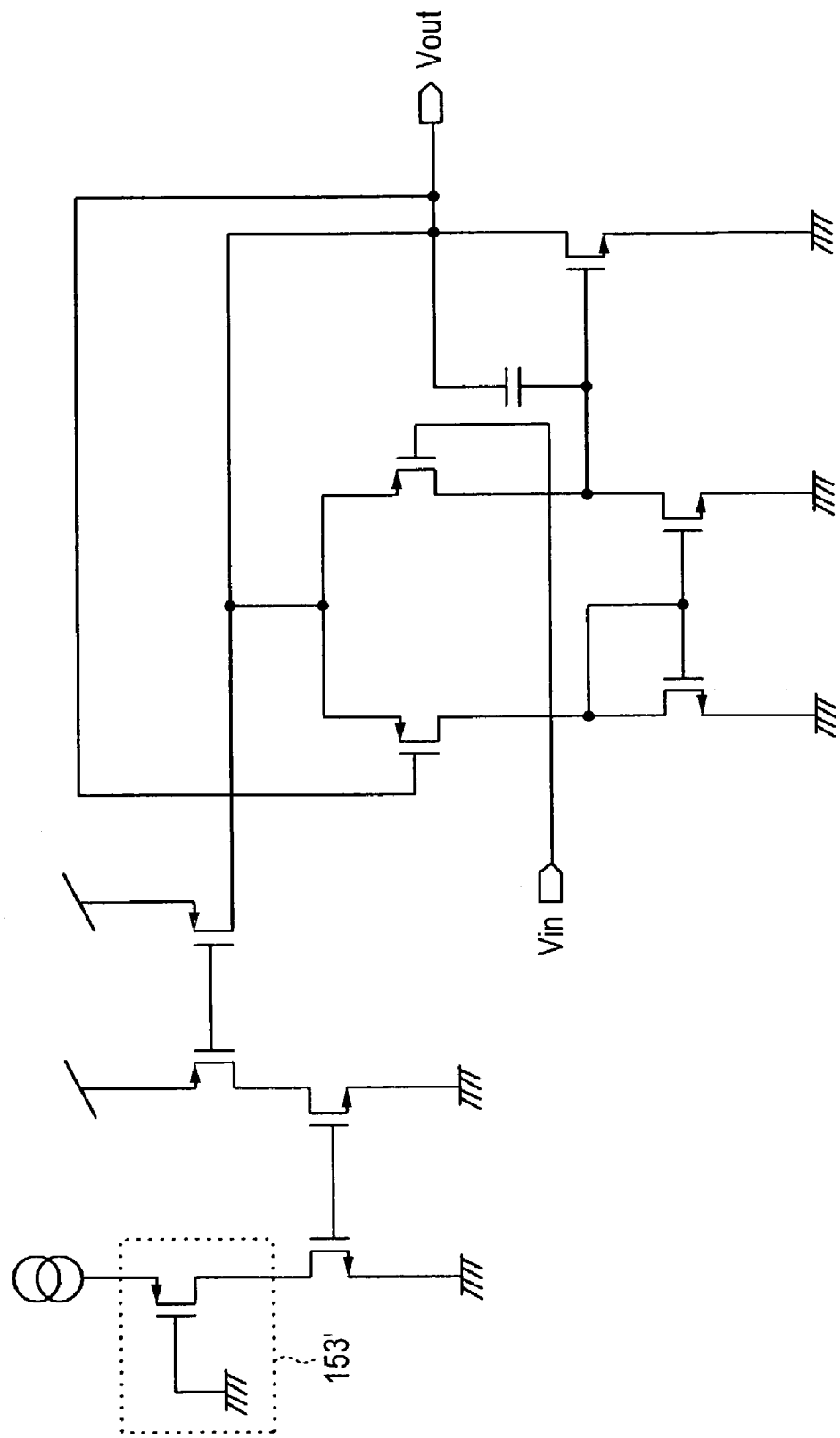
FIG. 16 is a circuit diagram of a configuration capable of supplying a bias current from a low withstand voltage current source to a high voltage operational amplifier via a clamping circuit.

As mentioned earlier, while the High output operational amplifier OPVcomH and the Low output operational amplifier OPVcomL are high voltage operational amplifiers, a bias current to be supplied to each operational amplifier may be supplied from a low withstand voltage current source such as band gap potential generating means via a clamping circuit 153'. Thus, it is possible to use a low withstand voltage current source as a bias current source of a high voltage operational amplifier. This eliminates the need for a special bias current source for a high voltage operational amplifier and reduces the footprint. FIG. 16 is a circuit diagram of a configuration capable of supplying a bias current from a low withstand voltage current source to a high voltage operational amplifier via a clamping circuit.

Figure 17:
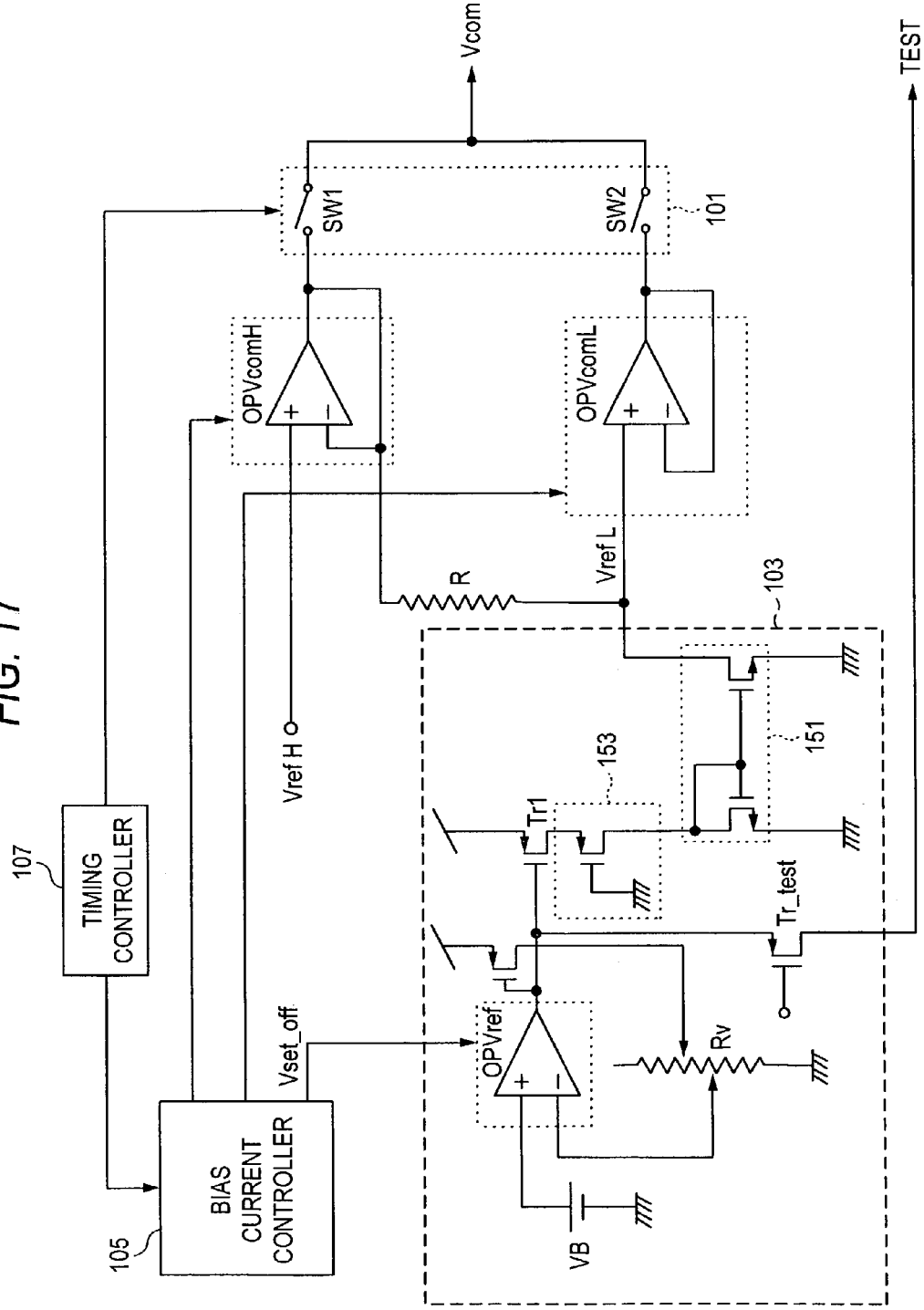
FIG. 17 is a circuit block diagram of a driving voltage controller where the output state of the Low voltage setting operational amplifier OPVref can be externally monitored.

The driving voltage controller may also comprise a terminal (not shown) for outputting an output signal of the Low voltage setting operational amplifier OPVref and a transistor Tr#test for enabling the output from the terminal in order to monitor the output state of the Low voltage setting operational amplifier OPVref. In case the output state of the Low voltage setting operational amplifier OPVref is monitored, the transistor Tr#test is to be turned on and output monitor means is to be connected to the terminal. FIG. 17 shows a driving voltage controller where the output state of the Low voltage setting operational amplifier OPVref can be externally monitored. In case the controller comprises a plurality of Low voltage setting operational amplifiers OPVref, selected transistors may be turned on to perform individual monitoring.

As mentioned earlier, a driving voltage controller according to the invention can prevent oscillation even in an operational amplifier to which a load is not connected and reduce power consumption by controlling the bias current flowing in the operational amplifier. The driving voltage controller does not require a capacitor (stabilizing capacitance), thus reducing the footprint of the controller.

What is claimed is:

1. A driving voltage controller for controlling a driving voltage to drive a load by using an alternating current comprising:
    a High output operational amplifier for outputting a High driving voltage and a Low output operational amplifier for outputting a Low driving voltage, wherein said High output operational amplifier and said Low output operational amplifier each includes a differential input stage and an output stage;
    an output switch for selecting one of the High driving voltage and the Low driving voltage as the driving voltage to electrically connect the load with either said High output operational amplifier or said Low output operational amplifier in accordance with a predetermined timing;
    a timing controller for controlling said output switch in accordance with the predetermined timing; and
    a bias current controller for controlling said High output operational amplifier and said Low output operational amplifier such that a bias current flowing in a differential input stage of an output operational amplifier out of said High output operational amplifier and said Low output operational amplifier in case that the output operational amplifier is not electrically connected to the load via said output switch is reduced less than the bias current flowing in the differential input stage of the output operational amplifier in case that the output operational amplifier is electrically connected to the load via said output switch or only the bias current flowing in the differential input stage of the output operational amplifier in case that the output operational amplifier is not electrically connected to the load via said output switch is interrupted by turning off a transistor included in the differential input stage of the output operational amplifier.

2. The driving voltage controller according to claim 1, wherein said timing controller controls said output switch such that a period in which the load is electrically connected to neither said High output operational amplifier nor said Low output operational amplifier via said output switch exists.

3. A driving voltage controller for controlling a driving voltage to drive a load by using an alternating current comprising:
    a High output operational amplifier for outputting a High driving voltage and a Low output operational amplifier for outputting a Low driving voltage, wherein said High output operational amplifier and said Low output operational amplifier each includes a differential input stage and an output stage;
    an output switch for selecting one of the High driving voltage and the Low driving voltage as the driving voltage to electrically connect the load with either said High output operational amplifier or said Low output operational amplifier in accordance with a predetermined timing;
    a timing controller for controlling said output switch in accordance with the predetermined timing; and
    a bias current controller for controlling said High output operational amplifier and said Low output operational amplifier such that a bias current flowing in an output stage of an output operational amplifier out of said High output operational amplifier and said Low output operational amplifier in case that the output operational amplifier is not electrically connected to the load is increased more than the bias current flowing in the output stage of the output operational amplifier in case that the output operational amplifier is electrically connected to the load.

4. The driving voltage according to claim 3, wherein said timing controller controls said output switch such that a period in which the load is electrically connected to neither said High output operational amplifier nor said Low output operational amplifier via said output switch exists.

5. A driving voltage controller for controlling a driving voltage to drive a load by using an alternating current, comprising:
    a High output operational amplifier for outputting a High driving voltage including a High phase compensating circuit capable of controlling a capacitance value and a resistance value included therein;
    a Low output operational amplifier for outputting a Low driving voltage including a Low phase compensating circuit capable of controlling a capacitance value and a resistance value included therein;
    an output switch for selecting one of the High driving voltage and the Low driving voltage as the driving voltage to electrically connect the load with either said High output operational amplifier or said Low output operational amplifier in accordance with a predetermined timing;
    a timing controller for controlling said output switch in accordance with the predetermined timing; and
    a phase compensating circuit controller for controlling said High output operational amplifier and said Low output operational amplifier such that a capacitance value included in an output operational amplifier out of said High operational amplifier and said low output operational amplifier in case that the output operational amplifier is not electrically connected to the load via said output switch is greater than a capacitance value included in the output operational amplifier in case that the output operational amplifier is electrically connected to the load via said output switch or a resistance value included in the output operational amplifier in case that the output operational amplifier is not electrically connected to the load via said output switch is greater than a resistance value included in the output operational amplifier in case that the output operational amplifier is electrically connected to the load via said input switch.

6. A driving voltage controller for controlling a driving voltage to drive a load by using an alternating current, comprising:
- a High output operational amplifier including a differential input stage and an output stage for outputting a High driving voltage, wherein an output of said High output operational amplifier is directly connected to the load without any intervening switch;
- a Low output operational amplifier including a differential input stage and an output stage for outputting a Low driving voltage, wherein an output of said Low output operational amplifier is directly connected to both the load and the output of said High output operational amplifier without any intervening switch;
- a bias current controller for controlling a bias current flowing in the output stage of said High output operational amplifier and said Low output operational amplifier by interrupting said bias current for a predetermined period with a predetermined timing; and
- a timing controller for controlling the timing of controlling the bias current flowing in said bias current controller.

7. A driving voltage controller for controlling a driving voltage to drive a load by using an alternating current, comprising:
- a High output operational amplifier for outputting a High driving voltage;
- a Low output operational amplifier for outputting a Low driving voltage;
- an output switch for alternating the connection of said load and said High output operational amplifier or said Low output operational amplifier with a predetermined timing;
- a timing controller for controlling the changeover timing of said output switch;
- a bias current controller for controlling a bias current flowing in said High output operational amplifier and a bias current flowing in said Low output operational amplifier based on said changeover timing; and,
- a voltage converter including a voltage source for generating a constant voltage, an operational amplifier including a negative feedback circuit having a variable resistor, said operational amplifier for regulating the amplitude of the output voltage of said voltage source, and a current mirror circuit for converting the output voltage of said operational amplifier to a high voltage;
- wherein said operational amplifier is a low voltage operational amplifier comprising low withstand voltage transistors, and
- wherein said voltage converter applies an output voltage as a set voltage of at least either said High output operational amplifier or said Low output operational amplifier.

8. The driving voltage controller according claim 7, wherein said voltage converter further includes a clamping circuit for preventing an overvoltage from being applied to the transistor at the input of said current mirror circuit.

9. A driving voltage controller for controlling a driving voltage to drive a load by using an alternating current, comprising:
- a High output operational amplifier including a differential input stage and an output stage for outputting a High driving voltage, wherein an output of said High output operational amplifier is directly connected to the load without any intervening switch;
- a Low output operational amplifier including a differential input stage and an output stage for outputting a Low driving voltage, wherein an output of said Low output operational amplifier is directly connected to both the load and the output of said High output operational amplifier without any intervening switch;
- a bias current controller for controlling a bias current flowing in the output stage of said High output operational amplifier and a bias current flowing in the output stage of said Low output operational amplifier such that a bias current flowing in an output stage of either said High output operational amplifier or said Low output operational amplifier is interrupted based on a predetermined timing; and,
- a timing controller for controlling said bias current controller to interrupt the bias current flowing in the output stage of either said High output operational amplifier or said Low output operational amplifier with the predetermined timing.

* * * * *